United States Patent [19]

Gray et al.

[11] Patent Number: 4,536,945

[45] Date of Patent: Aug. 27, 1985

[54] PROCESS FOR PRODUCING CMOS STRUCTURES WITH SCHOTTKY BIPOLAR TRANSISTORS

[75] Inventors: Bruce Gray, Danville; Kasivisvanatha Soundaranathan, San Jose; Franklin D. VanGieson, Sunnyvale, all of Calif.

[73] Assignee: National Semiconductor Corporation, Santa Clara, Calif.

[21] Appl. No.: 601,195

[22] Filed: Apr. 17, 1984

Related U.S. Application Data

[63] Continuation-in-part of Ser. No. 548,115, Nov. 2, 1983, abandoned.

[51] Int. Cl.³ ............................................. H01L 21/22
[52] U.S. Cl. .................................... 29/571; 29/576 B; 29/577 C; 29/578; 148/175; 148/187
[58] Field of Search ............... 148/175, 187, 1.5; 29/571, 576 B, 577 C, 578

[56] References Cited

U.S. PATENT DOCUMENTS

| | | | |
|---|---|---|---|
| 3,556,879 | 1/1971 | Mayer | 148/187 |
| 4,029,522 | 6/1977 | DeLa Moneda | 148/1.5 |
| 4,032,372 | 6/1977 | Vora | 29/576 E |
| 4,161,417 | 7/1979 | Yim et al. | 148/175 |
| 4,280,272 | 7/1981 | Egawa et al. | 148/1.5 X |
| 4,346,512 | 8/1982 | Liang et al. | 29/577 C |
| 4,354,307 | 10/1982 | Vinson et al. | 148/1.5 X |
| 4,441,932 | 4/1984 | Akasaka et al. | 148/187 X |
| 4,471,523 | 9/1984 | Hu | 148/1.5 X |

Primary Examiner—George T. Ozaki
Attorney, Agent, or Firm—Gail W. Woodward; Paul J. Winters; Michael J. Pollock

[57] ABSTRACT

A process is disclosed for making CMOS transistors in combination with self-aligned fully oxide isolated Schottky clamped bipolar transistors.

9 Claims, 14 Drawing Figures

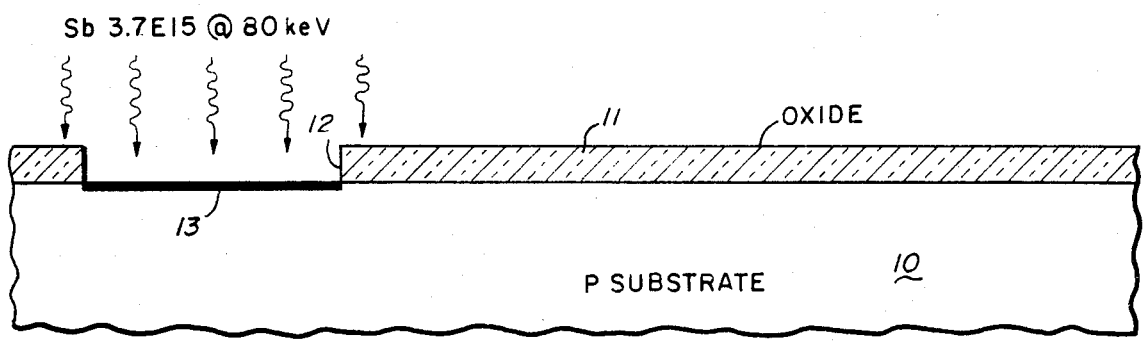
Fig_1
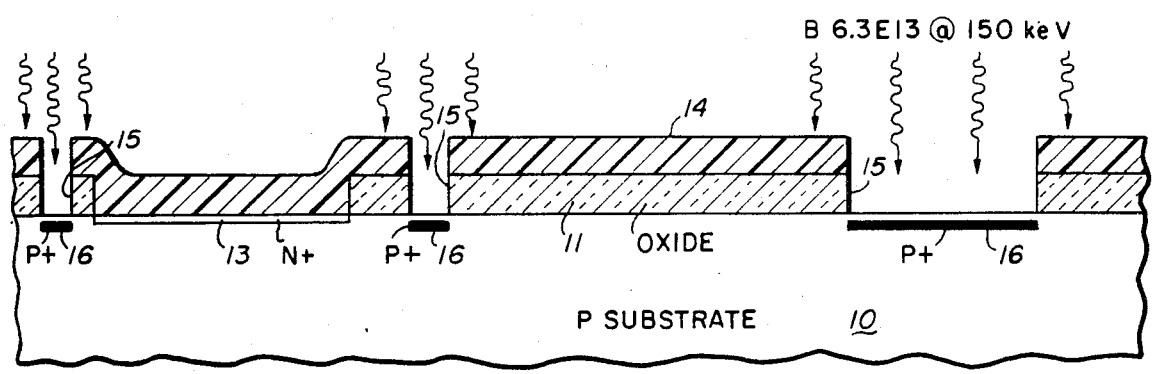
Fig_2
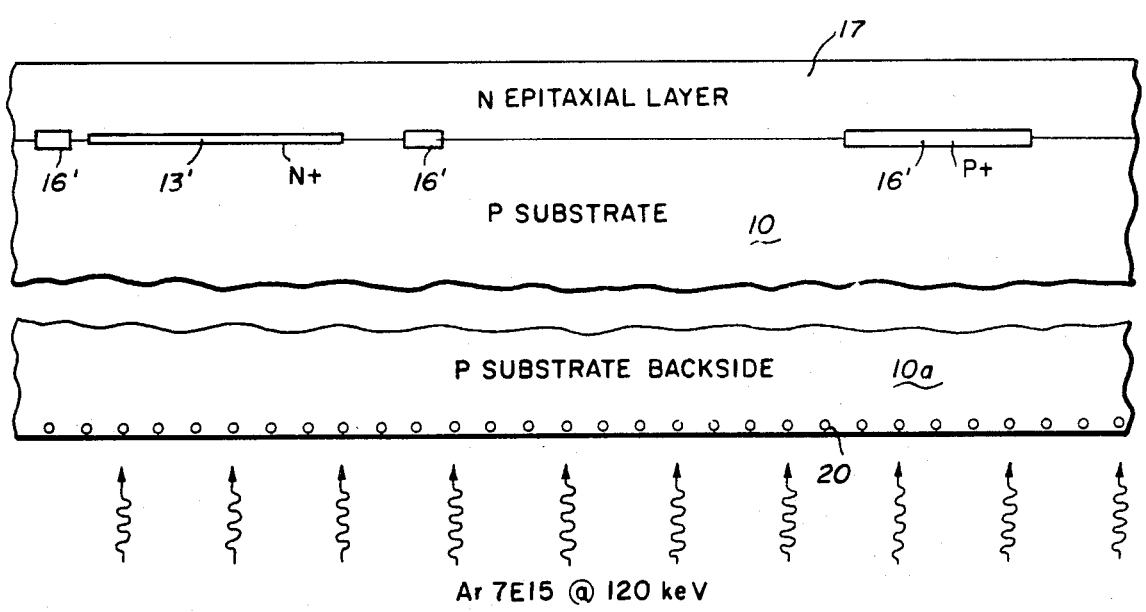
Fig_3

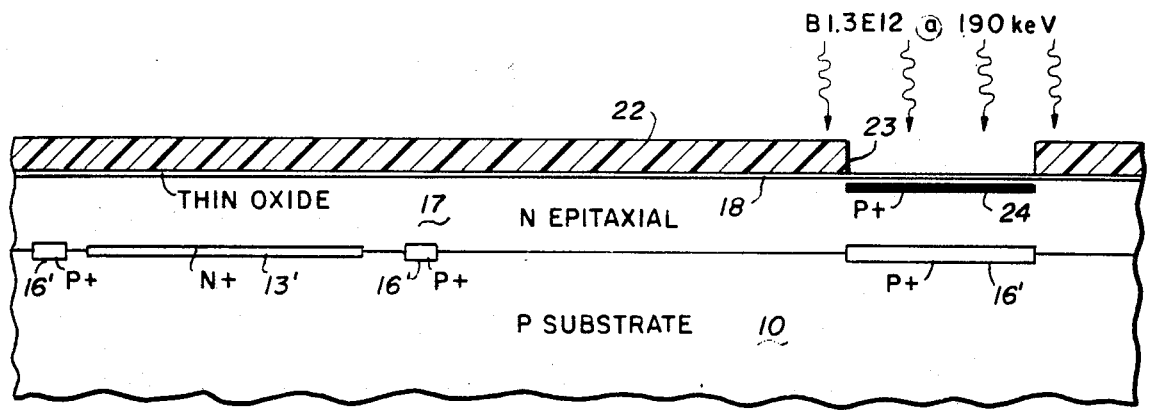
Fig_4
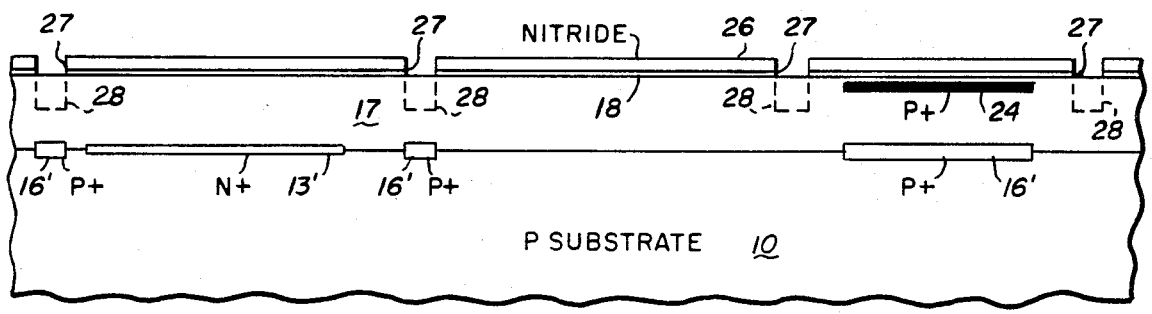
Fig_5
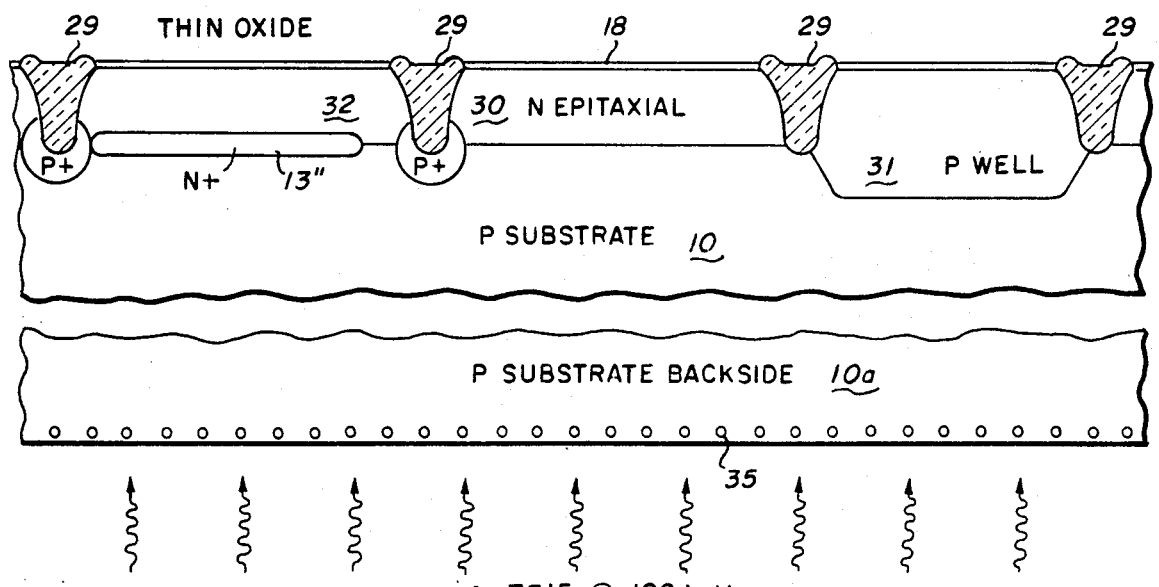
Fig_6

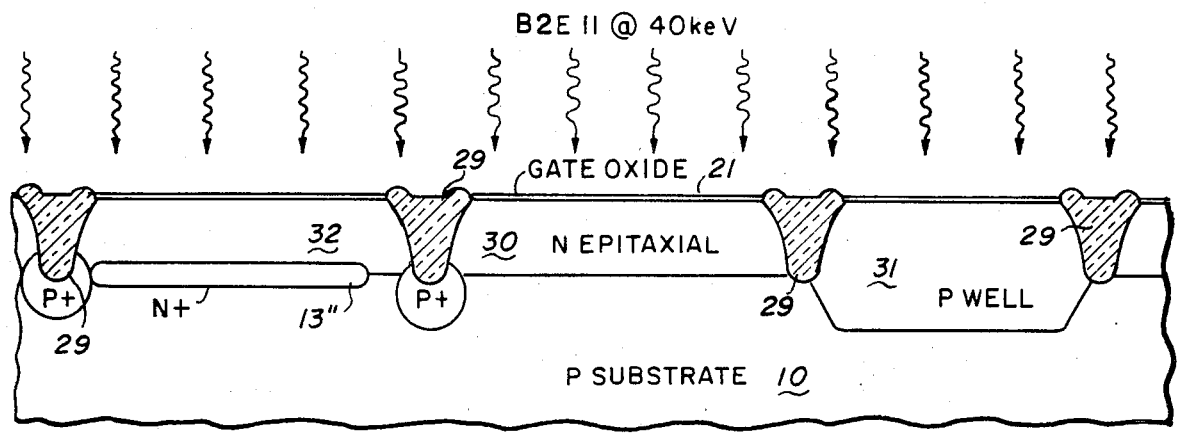
Fig_7
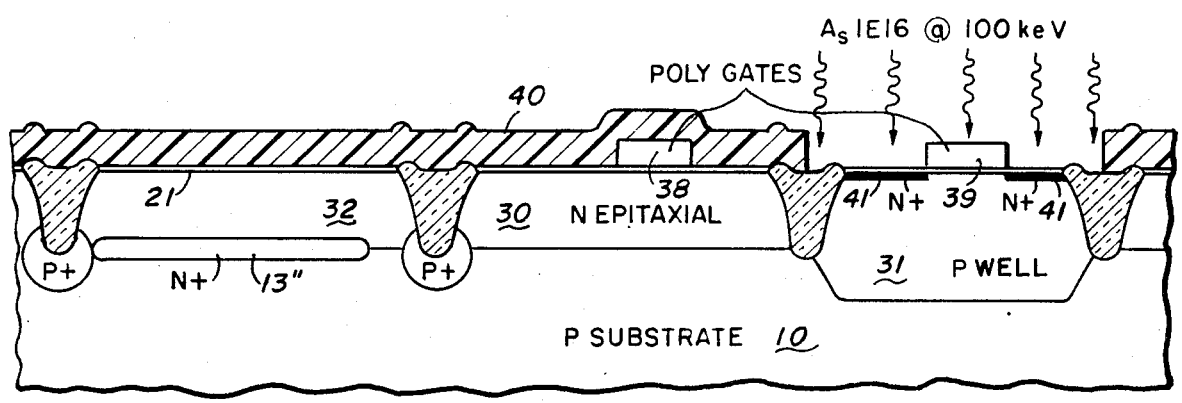
Fig_8
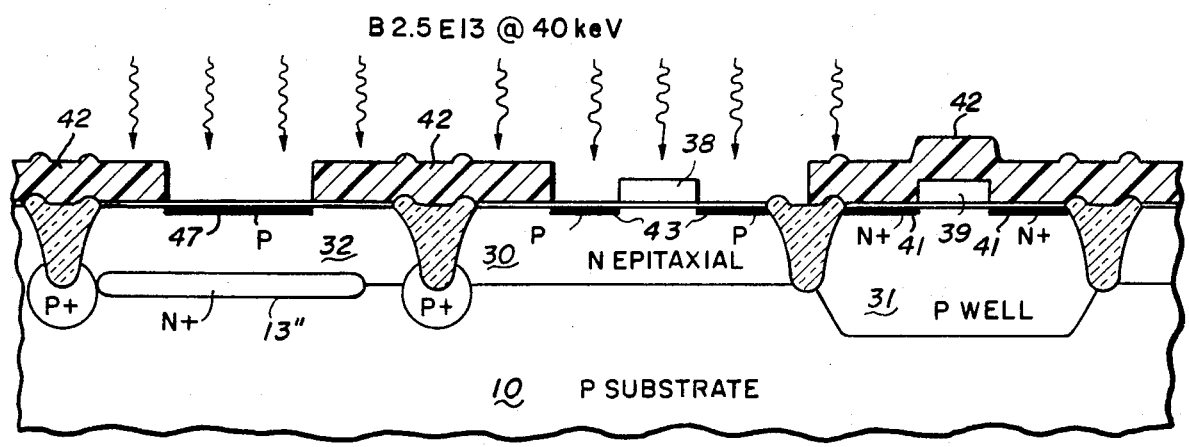
Fig_9

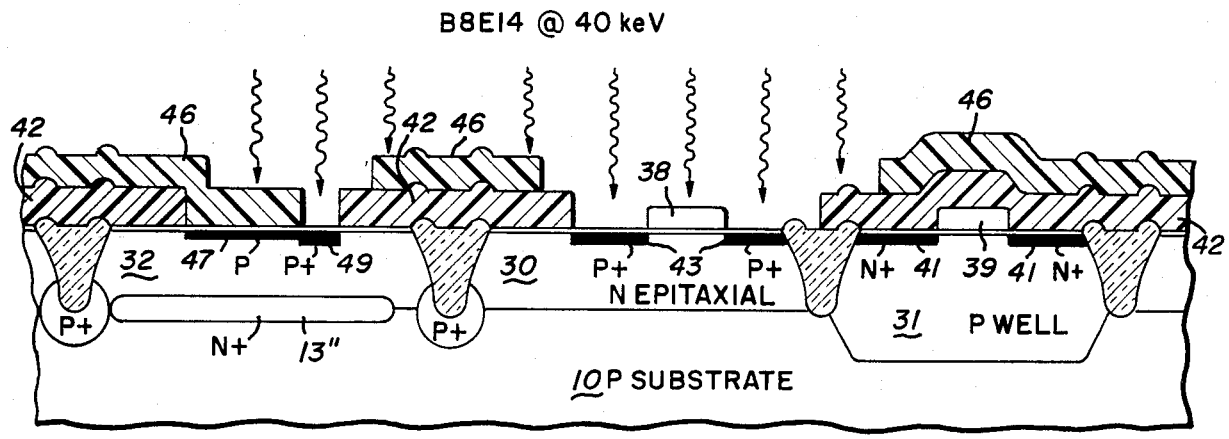
Fig_10
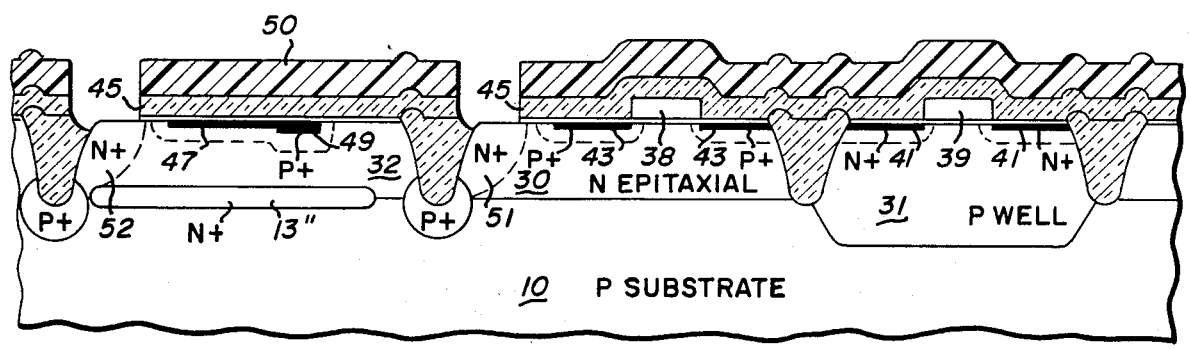
Fig_11
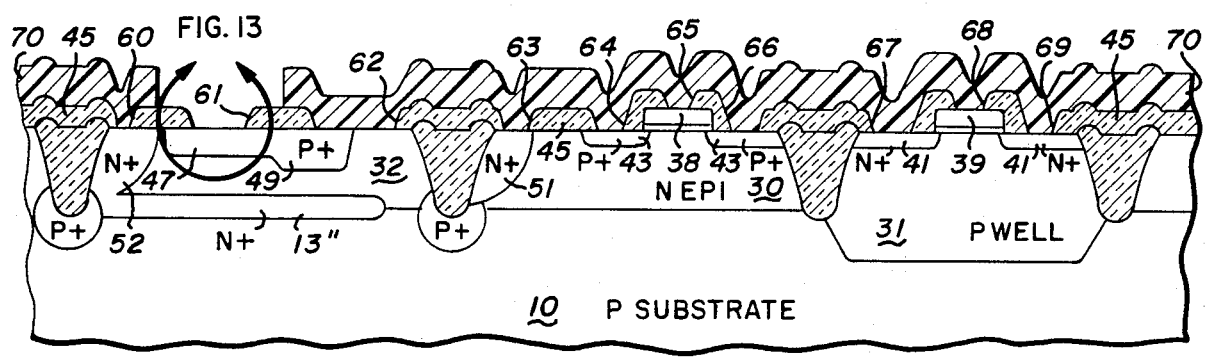
Fig_12

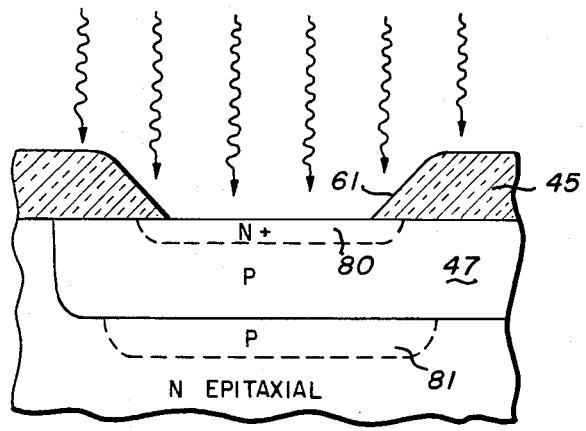
Fig_13
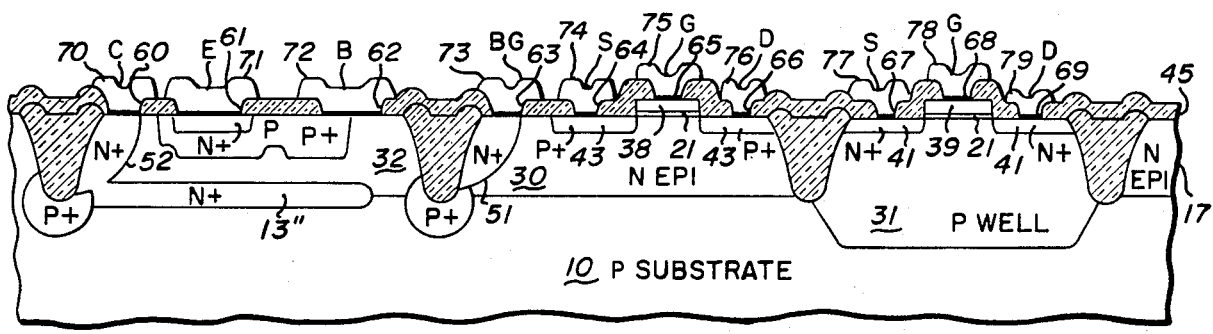
Fig_14

PROCESS FOR PRODUCING CMOS STRUCTURES WITH SCHOTTKY BIPOLAR TRANSISTORS

This application is a continuation in part of application Ser. No. 548,115 filed Nov. 2, 1983 now abandoned.

BACKGROUND OF THE INVENTION

Complementary metal oxide semiconductor (CMOS) structures ordinarily employ bipolar transistors that are made up of elements that are commonly regarded as parasitic because the various elements are intended for other functions. Typically one such element is dedicated to the substrate portion of the structure. For example in the so-called P well CMOS a P type well acts as a transistor base with an N channel MOS transistor source acting as the emitter. The collector is the CMOS N type wafer substrate. This produces a vertical NPN bipolar transistor. While the performance of such transistors is useful they are parasitic and not under primary process control. The dedicated collector terminal seriously limits the circuit configurations. It would be much more desirable to have a fully isolated three terminal transistor. Furthermore, it would be desirable in logic circuits to be able to employ oxide isolation and to make a Schottky clamped transistor for high speed switching as is found in the well-known advanced low-power Schottky (ALS) devices.

SUMMARY OF THE INVENTION

It is an object of the invention to provide a CMOS process that will also create Schottky vertical bipolar transistors that are fully isolated from the substrate.

It is a further object of the invention to start a CMOS process with a P type substrate wafer and to create N channel transistors in P wells that are dedicated to the substrate and to create isolated P channel transistors along with fully isolated NPN Schottky transistors.

These and other objects are achieved as follows. First a P type wafer is oxide masked and antimony is ion implanted into the wafer to create a buried collector layer in those areas where NPN transistors are to be created. Then P type buried layers are located in those regions where N channel transistors are to be created, and where oxide isolation is to be implemented, by a resist mask in combination with an oxide mask and the ion implantation of boron. Then the masks are removed and an epitaxial N type layer of semiconductor deposited over the wafer. At this point an argon ion implant is applied to the wafer backside to provide a crystal defect control and gettering. Next, a thin layer of oxide is grown on the epitaxial surface. At this point a second boron implant is applied in registry with the previously created P type buried layers. Then a silicon nitride oxidation mask is applied to the wafer and holes photolithographically etched into the nitride where oxidation is desired. Then the epitaxial layer is etched away in the nitride mask hole regions to about half of its original thickness. In the subsequent oxidation step the resulting oxide will grow up to about the original level of the semiconductor surface. The wafer is then subjected to an oxidizing atmosphere and heated until the oxide substantially penetrates the epitaxial layer thereby creating islands or tubs of oxide isolated epitaxial material. Where the oxide does not completely penetrate the epitaxial layer, it will meet an upwardly diffusing P+ buried layer. The isolation to the substrate is completed by PN junction action. After the oxidation action the two aligned boron deposits will have diffused to overlap each other so as to create a substrate connected P type well into which N channel transistors will be fabricated.

At this point the nitride oxidation mask is stripped off of the wafer and the backside again subjected to a second crystal defect control and gettering layer forming implant. Then the thin protective oxide is removed and a suitable gate oxide carefully grown on the exposed wafer surface.

Then the surface of the wafer is boron ion implanted for P channel transistor threshold control. Then the gate oxide is covered with vapor deposited polycrystalline silicon (poly) which is to become transistor gates. The poly is then doped to render it conductive and photolithographically etched to create the transistor gates.

Then the N channel transistor gate regions are used to self mask an arsenic ion implant using a suitable photoresist mask. This creates a deposit that will later become the sources and drains of the N channel transistors.

Then the P channel transistor gate regions are used to self mask an ion implant that is simultaneously employed to deposit the bipolar transistor base impurities. This is followed by a mask that exposes the bipolar transistor base contact areas and the P channel transistor source and drain regions. Then a heavy boron implant is employed. This creates a highly conductive base contact along with the source and drain regions of the P-channel transistors.

At this point the wafer surface is cleaned and a passivating oxide layer is deposited so as to cover the wafer including the poly gates.

Then a photomask is employed as an etch resist to remove the passivating oxide in edge regions in those epitaxial tubs where bipolar and P channel transistors are to be fabricated. After the etch resist is removed the wafer is subjected to a phosphorus deposition and diffusion to create ohmic contacts to those epitaxial tubs. This diffusion will contact the original N type buried layer deposit, thus making the bipolar transistor collector available at the wafer surface. It will also provide a back gate contact for the P channel transistors.

During this contact diffusion the bipolar transistor base and base contacts, along with the P channel and N channel source and drain contacts, will have diffused so as to penetrate the silicon to about their desired depths.

Then a photoresist mask is used as an etch resist to remove the passivating oxide in all contact regions. Then a photoresist is employed to mask a combination of boron and arsenic implants used to create both the transistor bases and emitters through the same mask opening. After the resist is removed, this is followed by an inert atmosphere anneal to activate the implants and diffuse them to their final positions.

The previously etched transistor base contact hole is made large enough to span not only the high conductivity base contact but also to overlap the epitaxial N type material in the collector. Next a layer of platinum is deposited over the wafer surface and sintered to create platinum silicide within the contact holes. Then the unreacted platinum is selectively etched away. Where the silicide lies over the collector of the bipolar transistor a Schottky diode is created and where it lies over the transistor base an ohmic contact exists. Thus a Schottky diode is automatically connected between collector and base of the transistor. This is substantially what is done in conventional ALS devices. Where the silicide comes into contact with the heavily doped MOS transistor source, gate, and drain contacts an ohmic contact results.

Then a conventional single metal layer is applied over the silicide in the usual IC manner. Alternatively, if a plural metal layer contact structure is desired, it can be applied conventionally over the silicide contacts. This metal is contoured in the usual manner to create the IC interconnects.

BRIEF DESCRIPTION OF THE DRAWING

FIGS. 1-14 of the drawing shows a fragment of an IC wafer in its sequential fabrication steps. It is to be understood that the drawing is not to scale. The vertical scale has been expanded to more clearly portray the structure. Furthermore, the various views do not fully show all of the surface contours that result from processing. For example, when an oxide masked diffusion is employed, the semiconductor surface is slightly depressed in the region where the original oxide is removed and regrown. In addition, the regrown oxide is ordinarily thinner than the original.

DESCRIPTION OF THE INVENTION

In FIG. 1 the substrate 10 is a P type <100> wafer of 25–45 ohm-centimeters resistivity. A 9.2kA oxide 11 is grown thereon. A hole 12 is photolithographically etched through the oxide in those regions where bipolar transistors are to be fabricated. The wafer is then ion implanted as indicated by the wavy arrows. The illustration includes a commonly used shorthand for ion implant. The first letters Sb indicate the species of ion - antimony in this case. The 3.7 E15 means that $3.7 \times 10^{15}$ atoms per cm$^2$ are deposited at 13 as an integrated dose. The last number 80 keV is the ion energy—in this case 80 thousand electron volts. At this energy the massive antimony atoms are implanted slightly into the silicon surface. This form of ion implant shorthand will be used throughout the following discussion. The values shown in the drawing comprise a preferred embodiment of the invention.

In FIG. 2 a resist 14 is shown for creating oxide layer holes 15. In this case the resist is left in place to cover hole 12 so that deposit 13 remains intact. Then a dose of $6.3 \times 10^{13}$ atoms per cm$^2$ of boron is implanted at 150 keV so that it forms a subsurface deposit 16 in those wafer regions where N channel transistors and channel stops are to be created. While not illustrated, substrate contacts can also be located during this implant operation. As will be seen below the right hand position of deposit 16 will ultimately form a P well that is ohmically connected to substrate 10. Such a P well can also be employed to make a topside substrate contact. For such a contact it is only necessary that a buried P type layer be located in registry with a topside deposited P-type layer so that the two will mingle and contact each other in a diffusion step. Such a topside contact can be placed anywhere it is desired to satisfy the IC requirements.

The resist and oxide layer 11 are then completely removed from the wafer 10 and an epitaxial layer 17 grown over the wafer as shown in FIG. 3. This layer is desirably about 1.5 ($\pm 0.2$) microns thick and has an N type resistivity of 2.0 to 2.7 ohm-centimeters. The orientation of layer 17 follows that of substrate 10 due to epitaxy. During epitaxy the buried layers will diffuse slightly into the substrate 10 and into epitaxial layer 17 as shown at 13' and 16'.

At this point the backside of wafer 10, shown as 10a, is subjected to argon ion bombardment at a dose of $7 \times 10^{15}$ atoms per cm$^2$ at 120keV. This produces a surface damage layer as shown by the circles at 20. This action creates a layer of damaged crystal material in which structural dislocations abound. These dislocations can diffuse through the silicon wafer to compensate dislocations produced on the opposed face in the fabrication process. Also, layer 20 can act to trap or getter normally mobile metal impurities in wafer 10 so as to immobilize them.

After the backside bombardment a thin protective oxide layer 18 is grown to a thickness of about 500 A over layer 17.

Then, as shown in FIG. 4, a resist 22 is applied with an opening 23 that matches the right hand hole 15 of FIG. 2 where an N channel transistor is to be fabricated. Then a dose of $1.3 \times 10^{12}$ atoms per cm$^2$ of boron is deposited at 190keV to create subsurface layer 24. Note that a light dose is employed at an energy of 190keV. This dose is selected so that, after all fabrication steps are completed, the N channel transistors will have the desired threshold voltage.

The wafer is then freed of resist and covered with a layer of deposited silicon nitride ($Si_3 N_4$) 26 which will act to resist oxidation of the underlying silicon. As shown in FIG. 5 the silicon nitride, along with the underlying thin oxide 18 is photolithographically removed at 27. Actually, while not illustrated, the cuts 27 represent the IC isolation which will be in the form of rings that will ultimately isolate portions of layer 17. At this point about half of layer 17, as represented by dashed lines 28, will be removed by an etch (either wet or dry).

The wafer is then subjected to an oxidation atmosphere so that the silicon oxidizes except under the nitride 26. Since half of layer 17 was etched away, when the remaining half is oxidized almost completely through, the oxide will build up to substantially the starting level of the wafer surface. If desired the oxide growth can initially be done in the presence of HCl, as will be described hereinafter, so as to produce a clean and relatively strain free growth interface. Then, after the oxide growth has started, a faster acting steam oxide growth atmosphere is switched on.

It will be noted that where the oxide is grown over the P type buried layers 16, as applied in FIG. 2, a P+ layer will be encountered diffusing upwardly. This means that the oxidation does not have to completely penetrate the epitaxial layer 17. Thus, even if epitaxial layer is of greater than nominal thickness, the oxide isolation will be effective.

After the epitaxial layer has been penetrated by the oxide, silicon nitride layer 26 is stripped off leaving the structure of FIG. 6. Oxide plugs 29 act to break up layer 17 into a plurality of isolated tubs. Tub 30 is of the original N type material and will ultimately contain a P channel transistor. Layers 24 and the registered portion of 16' will have diffused into each other during oxidation to create P well 31. Note that P well 31 extends into substrate 10 to make ohmic contact therewith. Thus in the completed IC the N channel transistors will all have their back gates substrate connected. Tub 32, which includes buried layer 13'', will ultimately contain a bipolar transistor.

At this point, as shown in FIG. 6, a second backside argon ion bombardment, using the same dosage as was described for FIG. 3, is employed to create crystal structure damage layer 35. While the original or first such treatment, shown in FIG. 3, created a damaged layer, the oxidation heat treatment will act to diffuse the dislocations. This FIG. 6 bombardment occurs after oxidation to create a new dislocation layer.

At this point the thin oxide 18 is removed and a gate oxide grown over the wafer as indicated by layer 21 of FIG. 7. Since this oxide is to ultimately be in the active transistors it is carefully grown to a thickness of 600 A in an oxiding atmosphere that contains a small (about 0.2%) quantity of HCl. This produces a stress free oxide that is relatively free of alkali metal atoms. Actually this HCl addition can also be employed in the creation of previously described oxide 18 and in the initial growth phase of oxides 11 and 29.

Then a dose of $2 \times 10^{11}$ atoms per cm$^2$ of boron is ion implanted at 40keV through gate oxide 21 into the silicon. This ion implant which is done at relatively low energy has its dose selected to provide the desired P channel transistor threshold after the processing of the IC is completed.

Then a layer of polycrystalline silicon (poly) deposited over the wafer on top of oxide 21 to a thickness of about 5000 A. The poly is then doped using conventional processing to a conductivity of 10-15 ohms/square. The poly is then photolithographically removed except where transistor gates are desired. Gate 38 of FIG. 8 is located where a P channel transistor will be fabricated and gate 39 will serve an N channel transistor. As shown in FIG. 8 a resist 40 is applied to protect the wafer, except for the N channel device and arsenic at a dose of $10^{16}$ atoms per cm$^2$ is ion implanted at 100keV to form source and drain N+ deposits 41. Note that gate 39 self masks the relatively heavy source and drain deposits 41 and so that mask 40 is not of critical precision.

Then as shown in FIG. 9, a new mask 42 is applied to cover the wafer except for tub 30 which will contain a P channel transistor and tub 32 where the bipolar transistor base will ultimately exist. A boron implant dose of $2.5 \times 10^{13}$ atoms per cm$^2$ is applied to the wafer in the bipolar transistor base 47 and P channel transistor source and drain regions 43. The dose is selected to optimize the bipolar transistor base conductivity. While not shown, at the same time mask 42 can be contoured to create IC resistors. The implant energy is at a relatively low value. Then, as shown in FIG. 10, a second mask 46 is applied over mask 42. This second mask has openings over the bipolar transistor base contact region 49 and over the P channel transistors. A heavy $8 \times 10^{14}$ atoms per cm$^2$ of boron implant is applied at relatively low energy 40keV to establish source and drain regions 43 along with base contact region 49. Again, while not shown, IC resistor contacts can be simultaneously created.

At this point the wafer is carefully cleaned and freed of resist traces and passivating oxide 45 deposited over the wafer (including gates 38 and 39) as shown in FIG. 11.

The next step, shown in FIG. 11, involves mask 50 which has openings located over the edges of tubs 30 and 32. This mask is employed as an etch resist to remove those portions of oxide 45 that are located inside the holes. Then resist 50 is removed and the wafer subjected to a conventional phosphorus predeposition and diffusion drive in. Oxide 45 resists this diffusion so that localized penetration of the phosphorus is accomplished. This creates an N+ contact to each of tubs 30 and 32 as shown by dashed lines 51 and 52. These N+ contacts provide ohmic connections for the backgate of the P channel transistor at 51 and the collector of the bipolar transistor at 52. Note that diffusion 52 extends to contact buried layer 13''. The diffusion step acts to regrow the oxide over the exposed silicon (not shown in FIG. 11). The phosphorus diffusion step involves a heat treatment that also acts to activate and diffuse previously applied deposits 41, 43, 47, and 49. This can be seen in the dashed outline showing of FIG. 11.

While oxide 45 will prevent phosphorus diffusion except where the holes have been photolithographically etched, the surface will be exposed to phosphorus oxide. This creates a surface layer of phosphosilicate glass (PSG) which has the ability to getter alkali metal ions which might otherwise cause trouble after the IC is completed. Such PSG is well known to have a very beneficial stabilizing influence on IC transistor parameters.

Then as shown in FIG. 12 contact holes are photolithographically etched into oxide 45 using a conventional contact mask configuration. These holes are labeled as 60–69 and will ultimately contain metallization that will form the transistor contacts. Holes 60–62 will be the bipolar transistor collector, emitter and base contacts respectively. Holes 63–66 will be the back gate, source, gate and drain contacts respectively of the p-channel transistor. Holes 67–69 will be the source, gate and drain contacts respectively of the N-channel transistor. Desirably these holes are photolithographically etched using a wet process that leaves the oxide holes tapered as shown. Then resist 70 is applied to cover the wafer except for contact hole 61. At this point a dual boron and arsenic implant is applied at relatively high energy. These duel implants respectively are at doses of $2.5 \times 10^{13}$ atoms per cm$^2$ at 85keV and $10^{16}$ atoms per cm$^2$ at 100 keV. FIG. 13 is an enlarged view of the wafer region around hole 61.

Arsenic, being a relatively heavy species, does not penetrate to a large extent thereby producing an N+ implant in region 80. However, the boron which is implanted at relatively high energy penetrates to create a base extension layer at 81. Also, since there will be substantial penetration of the tapered oxide at hole 61 the lateral extent of region 81 will exceed that of region 80. Thus, since the dual implant is masked by oxide 45, the emitter implant at 80 will always be surrounded by the base implant at 81. This means that the bipolar transistor's emitter is automatically self-aligned with the base.

If desired bipolar transistor's collector contact 52 of FIG. 12 can also be subjected to the implants of FIG. 13. This will reduce the collector contact resistance. Since region 52 is heavily doped with phosphorus the boron will be overwhelmed but the arsenic will supplement the phosphorus at the wafer surface. Then the resist is removed and the wafer carefully cleaned, after which the emitter and base ion implants 80 and 81 are annealed in inert atmosphere. This activates the deposits and causes them to diffuse slightly but does not oxidize the silicon exposed in the openings. Since boron diffuses faster than arsenic the boron extends the transistor's base as shown by dashed line 81 of FIG. 13. The arsenic diffuses to dashed line 80 to form the transistor's emitter. The boron ion implant dosage in contact region 49 is selected to produce a bipolar transistor base contact region resistance of about 200 ohms/square after processing. The base resistance in region 47 after processing is about 2K ohms/square. This completes the high temperature processing. All of the subsequent steps are well known in the ALS prior art.

Next, the wafer is coated with platinum. The wafer is then sintered to react the platinum with the silicon where the platinum touches silicon in contact holes 60–69 previously etched in layer 45 as shown by the heavy line portions of FIG. 14. This creates a thin platinum silicide layer in each of the contact holes. The remaining unreacted platinum is then removed with an aqua-regia etch. It will be noted that the platinum silicide inside hole 62 overlaps both the base contact and the epitaxial N type material collector. Since the base contact is relatively heavily doped, the silicide contact thereto is ohmic. Where the silicide extends over the relatively lightly doped collector in tub 32 a Schottky diode is formed. Thus the collector-base junction of the bipolar transistor has a parallel-connected Schottky diode. If a conventional transistor (or non-Schottky device) is desired hole 62 is confined to the base contact region.

Where the platinum silicide contacts a heavily doped silicon surface as is the case at holes 60, 61 and 63–69, a highly conductive ohmic contact results. Then a layer of titanium-tungsten alloy is deposited over the wafer followed by a thick layer of aluminum. These metal layers are photolithographically contoured to create contacts 70–79. Contacts 70–72 represent collector, emitter, and base, respectively, of the Schottky clamped bipolar transistor. Contacts 73–76 represent the P channel transistor's back gate, source, gate, and drain, respectively. Contacts 77–79 represent the N channel transistor's source, gate, and drain, respectively.

If desired, as an alternative, the aluminum layer can be replaced with a relatively thin aluminum-copper alloy and then the etched metal overcoated with an insulating layer with vias and a second layer of interconnecting metal applied. This two metal layer approach is preferred where relatively complex interconnections are required.

After metallization the wafer can be coated conventionally by layers (not shown) of vapor deposited oxide and vapor deposited nitride for passivation and protection.

The invention has been described and all of the critical process steps detailed. When a person skilled in the art reads the foregoing description, equivalents and alternatives, within the spirit and intent of the invention, will become apparent. Accordingly it is intended that the scope of the invention be limited only by the following claims.

We claim:

1. In a process for forming isolated bipolar transistors, in combination with CMOS transistors, the steps comprising:

starting with a semiconductor wafer of a first conductivity type;

depositing a first impurity of an opposite conductivity type and heavy concentration in those regions where bipolar transistors are to be fabricated;

depositing a second impurity of said first conductivity type and heavy concentration in those regions where CMOS transistors having a channel conductivity of said opposite conductivity type are to be fabricated;

depositing a layer of epitaxial semiconductor material of said opposite conductivity type over said wafer and said first and second impurity regions;

depositing a third impurity of said first conductivity type on the surface of said epitaxial layer in those regions where said CMOS transistors having a channel conductivity of said opposite conductivity type are to be fabricated;

depositing an oxidation resistant coating over said epitaxial layer;

removing said oxidation resistant coating in the regions between said transistors wherein isolation is desired;

heating said wafer in an oxidizing atmosphere wherein said semiconductor is oxidized and continuing said heating until said epitaxial layer is approximately penetrated by the resulting oxide, said heating acting simultaneously to cause said second and third impurities to diffuse towards each other to contact each other and thereby from a well of said first conductivity type in said epitaxial layer;

forming a gate oxide;

depositing a polycrystalline semiconductor layer over said gate oxide and doping said layer to make it conductive;

removing said polycrystalline semiconductor layer except in those regions where CMOS transistor gates are desired;

masking said wafer with a resist having openings located in those regions where CMOS transistors having a channel conductivity of said opposite conductivity type are desired and depositing a fourth impurity of said opposite conductivity type at a heavy dose whereby the polycrystalline gates exposed in said openings are doped and act to self align the deposit to create transistor source and drain regions;

masking said wafer with a resist having openings located in those regions where bipolar transistor bases and CMOS transistors sources and drains having a channel conductivity of said first conductivity type are desired and ion implanting a fifth impurity of said first conductivity type at a low dose;

masking said wafer with a resist having openings located in those regions where bipolar transistor base contacts and CMOS transistors sources and drains having a channel conductivity of said first conductivity type are desired and ion implanting a sixth impurity of said first conductivity type to a level of doping substantially higher than that of said fifth impurity;

depositing a passivating oxide over said wafer thereby to cover said polycrystalline gates, said fourth and fifth impurity deposits, and said bipolar transistor regions;

masking said wafer with a resist having openings located in those regions where bipolar transistor collector contacts and CMOS transistor back gate contacts are desired, removing said passivating oxide exposed in said mask openings and diffusing a seventh impurity of said opposite conductivity type through the openings thus created in said passivating oxide to an extent where said seventh impurity contacts said first impurity;

masking said wafer with a resist having openings located where active device contact electrodes are desired for said CMOS and said bipolar transistors and etching holes in said passivating oxide;

masking said wafer with a resist having openings located in those regions where bipolar transistor emitters are desired and implanting into the thus exposed semiconductor an eighth impurity of said first conductivity type and a ninth impurity of said opposite conductivity type, said eighth impurity being deposited to a level selected to develop the desired bipolar transistor base region and said ninth impurity being deposited to a level in said semiconductor to develop the desired bipolar transistor emitter;

heating said wafer to activate and diffuse said eighth and ninth impurities; and applying metallization to said electrodes.

2. The process of claim 1 wherein said starting semiconductor wafer is P type silicon; said epitaxial layer is N type; said first impurity is antimony; said second, third, fifth, sixth, and eighth impurities are boron; said seventh impurity is phosphorus; and said fourth and ninth impurities are arsenic.

3. The process of claim 2 wherein all impurities, except for said seventh impurity, are ion implanted.

4. The process of claim 3 wherein the backside of said water is subjected to argon ion implant after said oxidation step to introduce dislocations therein.

5. The process of claim 4 further including a backside argon ion implant prior to said oxidation step.

6. The process of claim 4 further including the additional step of ion implanting an impurity of said first type, prior to said depositing of said polycrystalline semiconductor layer, to adjust, in combination with said third impurity the threshold of said transistors as measured after processing is completed, said additional step being applied after said backside ion bombardment step.

7. In a process for fabricating bipolar transistor emitter and base regions nested within a collector region in a monolithic integrated circuit semiconductor wafer, the improvement comprising the steps:

forming a passivating oxide, composed primarily of an oxide of said wafer material, on said wafer;

etching an opening in said oxide where said emitter is desired;

implanting base and emitter impurities into said wafer with said opening acting as an implant mask, wherein said base impurity species is selected to be lighter than said emitter impurity species; and annealing said wafer to activate said impurities whereby said base impurities surround said emitter impurities.

8. The process of claim 7 wherein said opening is etched to create a tapered oxide edge.

9. The process of claim 8 wherein said emitter impurity is arsenic and said base impurity is boron.

* * * * *